(12) United States Patent
de Groot

(10) Patent No.: US 6,417,927 B2
(45) Date of Patent: *Jul. 9, 2002

(54) METHOD AND APPARATUS FOR ACCURATELY COMPENSATING BOTH LONG AND SHORT TERM FLUCTUATIONS IN THE REFRACTIVE INDEX OF AIR IN AN INTERFEROMETER

(75) Inventor: Peter J. de Groot, Middletown, CT (US)

(73) Assignee: Zygo Corporation, Middlefield, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/301,301

(22) Filed: Apr. 28, 1999

(51) Int. Cl.$^7$ ................ G01N 21/41; G01N 21/43; G01B 9/02

(52) U.S. Cl. ........................ 356/517; 356/486

(58) Field of Search ............... 356/361, 349, 356/358, 73

(56) References Cited

U.S. PATENT DOCUMENTS

| 4,733,967 A | | 3/1988 | Sommargren | |
|---|---|---|---|---|
| 4,813,783 A | | 3/1989 | Torge | |
| 4,948,254 A | | 8/1990 | Ishida | |
| 5,313,271 A | * | 5/1994 | Chaney | 356/361 |
| 5,392,120 A | * | 2/1995 | Kamiya | 356/358 |
| 5,404,222 A | | 4/1995 | Lis | |
| 5,748,313 A | * | 5/1998 | Zorabedian | 356/345 |
| 5,764,362 A | | 6/1998 | Hill et al. | |
| 5,838,485 A | | 11/1998 | de Groot et al. | |
| 5,991,033 A | * | 11/1999 | Henshaw et al. | 356/349 |
| 6,014,216 A | * | 1/2000 | Zorabedian | 356/349 |

OTHER PUBLICATIONS

Bobroff, Norman,"Recent advances in displacement measuring interferometry", Measurement Science And Technology, vol. 4, No. 9, Sep. 1993.

* cited by examiner

Primary Examiner—Frank G. Font
Assistant Examiner—Phil Watt
(74) Attorney, Agent, or Firm—Francis J. Caufield

(57) ABSTRACT

Methods and apparatus that combine dispersion interferometry with refractometry to compensate for refractive index fluctuations in the measurement path of a dispersion interferometer over both short and long time periods. Dispersion and refractometry data are weighted over appropriate time intervals, and means and methods are also provided for initializing Γ, the inverse dispersive power, so that the dispersion and refractometry data are self consistent. A refractometer is placed in close proximity to the measurement path of the dispersion interferometer to experience substantially the same air flow and act as a surrogate for obtaining information about the index of refraction.

20 Claims, 11 Drawing Sheets

METHOD AND APPARATUS FOR ACCURATELY COMPENSATING BOTH LONG AND SHORT TERM FLUCTUATIONS IN THE REFRACTIVE INDEX OF AIR IN AN INTERFEROMETER

BACKGROUND OF THE INVENTION

This invention, in general, relates to interferometric methods and apparatus for measuring linear and/or angular displacements and, in particular, to apparatus and methods by which fluctuations in the index of refraction in the measurement path of a displacement measuring interferometer (DMI) can be accurately compensated for in determinations of displacement.

High-precision displacement measuring interferometry (DMI) depends on an accurate determination of the index of refraction, n, in the measurement path. One way to determine n is to place sensors in close proximity to the measurement path to monitor thermodynamic properties such as pressure, temperature, and humidity, and then use the values of those parameters together in well-known expressions relating index of refraction to monitored properties as, for example, Edlén's equation with modern corrections for the index of refraction of air (See "Recent advances in displacement measuring interferometry", Bobroff, Norman, Measurement Science and Technology, Vol. 4, Number 9, September 1993). If required, sensors for detecting the composition of the gas in the measurement path may also be employed to further refine the calculation of the index of refraction. For example, $CO_2$ sensors may be usefully employed.

While few applications require greater absolute accuracy in the calculated value of n than can be obtained using Edlén's equation in combination with environmental monitoring, all DMI systems are extremely sensitive to index fluctuations after initialization. This is particularly true for the case of a microlithography tool where DMI metrology is an integral part of the wafer and reticle positioning systems. Here, the most severe requirements are placed on the repeatability and stability of the DMI measurements for the purposes of accurate overlay.

In addition to providing continuous data free of high-frequency noise, a microlithography DMI must be stable over the entire time needed for a single wafer exposure, including whatever time is needed for wafer alignment. For some measurements, such as establishing the "baseline" metrology between through-the-lens and off-axis alignment sensors, the interferometer system must be stable for several hours. In both of these situations, undetected changes in the index n can have serious consequences. A typical target stability for DMI in the next generation of steppers is 1 nm. The corresponding minimum allowable fluctuation in index in the measurement path is therefore $10^{-9}$ over a 1-m distance within a bandwidth of $10^{-4}$ to $10^2$ Hz. Detection of these fluctuations is presently beyond the capability of environmental sensors.

Accordingly, there has been a great deal of interest in compensation systems that deal with the problem of fluctuations in the refractive index n for microlithography tools. One approach has been the use of a refractometer, also called a wavelength tracker or compensator. Such devices, which are commercially available, are actually relative refractometers. If properly positioned in the path of the forced air flow in a photolithography tool, the information from a refractometer can be used to accurately compensate for low frequency (e.g. $10^{-2}$ Hz) changes in index.

Another approach to this problem has been the use of air turbulence compensation systems (ATC), which are based on dispersion interferometry. ATC systems use two widely-separated wavelengths and rely on the wavelength dependence of index of refraction. This wavelength dependence is characterized by the inverse dispersive power $\Gamma$, which is the ratio of the refractivity at one wavelength to the difference in refractivity between two wavelengths. Typical values of $\Gamma$ for air are between 15 and 75.

It is accordingly, a primary object of this invention to provide apparatus and methods by which dispersion interferometry may be combined with refractometry to compensate for both short and long term index of refraction fluctuations that may occur in the measurement path of an interferometer.

It is another object of this invention to provide apparatus and methods by which the inverse dispersion power may be initialized and monitored prior to displacement calculations.

It is yet another object of the invention to provide apparatus and methods by which index of refraction may be determined by using known physical lengths.

Other objects will in part be obvious and will in part appear hereinafter when the following detailed description is read in connection with the drawings.

SUMMARY OF THE INVENTION

The invention combines dispersion interferometry with refractometry to compensate for refractive index fluctuations over both short and long time periods. It, accordingly, includes a method and means for weighting the dispersion and refractometry data, as well as a method and means of initializing $\Gamma$ so that the dispersion and refractometry data are self consistent and can be used to accurately calculate physical displacements.

The inventive apparatus comprises:

interferometer means employing at least two wavelengths at least a first one of which is used for measuring the displacement of an object along a measurement path and for detecting short-term fluctuations in the refractive index of air directly within the measurement path by means of the inverse dispersive power $\Gamma$ or its equivalent;

at least one refractometer means for measuring the long-term variations in refractive index of air directly for at least the first wavelength, placed as close as practicable to the measurement path, and preferably within the path of any forced airflow directed at the measurement path;

initialization means for establishing an initial value of the inverse dispersive power $\Gamma$ using refractometer and dispersion data acquired during a change in the length of the measurement path; and computational means for analyzing data from the refractometer and said dispersion interferometer and for providing a calculated refractive index along said measurement path, said calculated refractive index incorporating both long- and short-term fluctuations and employing said initial value of said inverse disperse power $\Gamma$.

In another aspect the interferometer means may be in the form of a separate displacement interferometer operating at the first wavelength and a second dispersion interferometer operating at two wavelengths, one of which may be the first wavelength.

Another aspect of the invention is a method comprising the steps of:

storing a self-consistent value of inverse dispersive power, $\Gamma$. Initially, this may be assumed and later updated as significant changes in it occur;

measuring the refractive index for $\lambda_1$ using a refractometer located near the measurement path;

determining a time average for the refractive index generated in step over a characteristic time period (Eq. 3)

measuring the optical path length of the measurement path for wavelengths, $\lambda_{1,2}$ (Eq. 2);

calculating the local index, $N_1^{2\lambda}$ using dispersion interferometry (Eq. 6);

time averaging the local dispersion (Similar to Eq. 3);

calculating the fluctuation the local index as the difference between the instantaneous value and time averaged value (Eq. 4);

calculating the physical distance corrected for atmospheric effects (Eq. 6; and testing for the difference between the time averaged value of the local index and the time averaged value of the index at the refractometer;

calibrating $\Gamma$ and updating its value should $\Gamma$ change significantly.

Another aspect of the invention relates to a method for calibrating the inverse dispersive power comprising the steps of:

measuring the refractive index for $\lambda_1$ using a refractometer near the measurement path;

determining the time average of the refractive index near the measurement path over a characteristic time T;

moving the stage between two positions;

measuring the change in optical path length of the measurement path for two wavelengths, $\lambda_{1,2}$;

calculating the inverse dispersive power, $\Gamma$, using Eq. 1; and returning to the measurement path with the value for $\Gamma$.

In yet another aspect of the invention, the index is determined by using a known physical distance between two reference points instead of a refractometer.

BRIEF DESCRIPTION OF THE DRAWINGS

The structure and operation of the invention, together with other objects and advantages thereof, may best be understood by reading the detailed description in conjunction with the drawings wherein the invention's parts have an assigned reference numeral that is used to identify them in all of the drawings in which they appear and wherein:

FIG. 3a representing the steps for making measurements and

FIG. 3b the steps for initializing for the inverse dispersive power, $\Gamma$, to update values of $\Gamma$ used in the measurement steps;

FIGS. 7–9 relate to lithography and its application to manufacturing integrated circuits wherein FIG. 7 is a schematic drawing of a lithography exposure system employing the interferometry system;

FIGS. 8 and 9 are flowcharts describing steps in manufacturing integrated circuits.

DETAILED DESCRIPTION OF THE INVENTION

This invention relates to interferometric apparatus and methods by which short and long term index of refraction fluctuations in the measurement path of a displacement measurement interferometer may be compensated for in determining displacement. The invention combines dispersion interferometry with refractometry to compensate for refractive index fluctuations over both short and long time periods. Included are a method and means for weighting dispersion and refractometry data, as well as a method and means of initializing $\Gamma$, the inverse dispersive power, so that the dispersion and refractometry data are self consistent.

Figure 1:
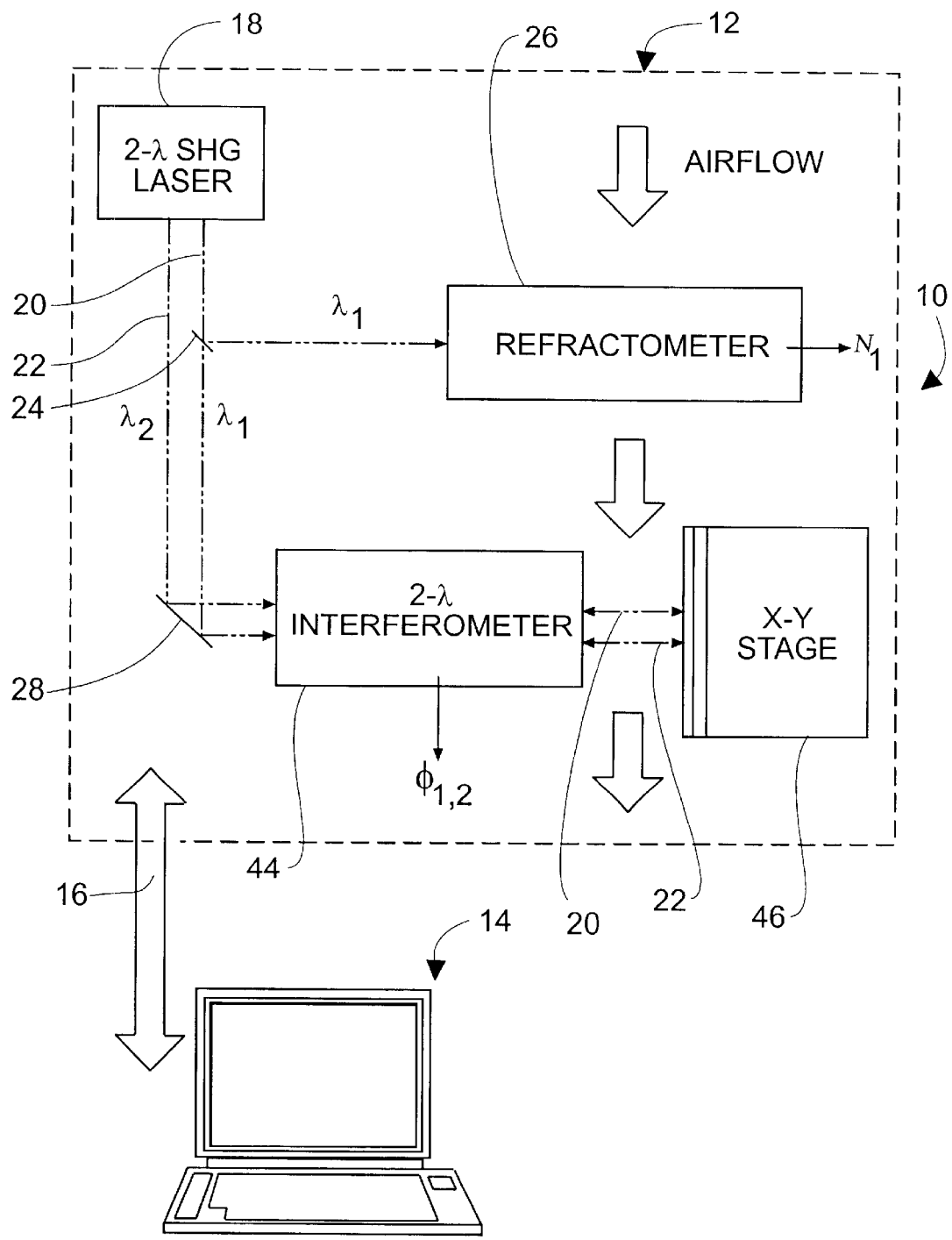
FIG. 1 is a diagrammatic view of an interferometric system of the invention.

Referring now to FIG. 1, there is diagrammatically shown at 10 an interferometric system of the invention. System 10 comprises interferometric apparatus 12 and a computer 14 that interfaces with the interferometric apparatus 12 in a well-known manner via link 16 to exchange housekeeping and control signals. Resident in computer 14 is application software for implementing various algorithms that are subsequently described and system software by which a user can operate system 10 through the use of a graphical user interface (GUI) and/or other input devices such as a keyboard or mouse.

Interferometric apparatus 12 preferably comprises a two-wavelength source 18, with a first wavelength $\lambda_1$ and a second wavelength $\lambda_2$ that is phase locked to the first wavelength $\lambda_1$ by, e.g., means of frequency doubling (SHG= second harmonic generation). Example wavelengths are 633 and 316 nm for $\lambda_{1,2}$, respectively, as measured in a vacuum. Source 18 generates a first beam 20 at $\lambda_1$ and a second beam 22 at $\lambda_2$.

It will be appreciated by those skilled in the art that beams 20 and 22 may be provided alternatively by a single laser source emitting more than one wavelength, two laser sources of differing wavelengths combined with sum-frequency generation or difference-frequency generation, or any equivalent source configuration capable of generating light beams of two or more wavelengths.

A laser source, for example, can be a gas laser, e.g. a HeNe, stabilized in any of a variety of conventional techniques known to those skilled in the art, see for example, T. Baer et al., "Frequency Stabilization of a 0.633 μm He—Ne-longitudinal Zeeman Laser," *Applied Optics*, 19, 3173–3177 (1980); Burgwald et al., U.S. Pat. No. 3,889,207, issued Jun. 10, 1975; and Sandstrom et al., U.S. Pat. No. 3,662,279, issued May 9, 1972. Alternatively, the laser can be a diode laser frequency stabilized by one of a variety of conventional techniques known to those skilled in the art, see, for example, T. Okoshi and K. Kikuchi, "Frequency Stabilization of Semiconductor Lasers for Heterodyne-type Optical Communication Systems," *Electronic Letters*, 16, 179–181 (1980) and S. Yamaqguchi and M. Suzuki, "Simultaneous Stabilization of the Frequency and Power of an AlGaAs Semiconductor Laser by Use of the Optogalvanic Effect of Krypton," *IEEE J. Quantum Electronics,* QE-19, 1514–1519 (1983).

Beam 20 is intercepted by a beamsplitter 24 that directs part of it by reflection to a refractometer 26 while transmitting the remainder of it to a mirror 28.

Figure 2:
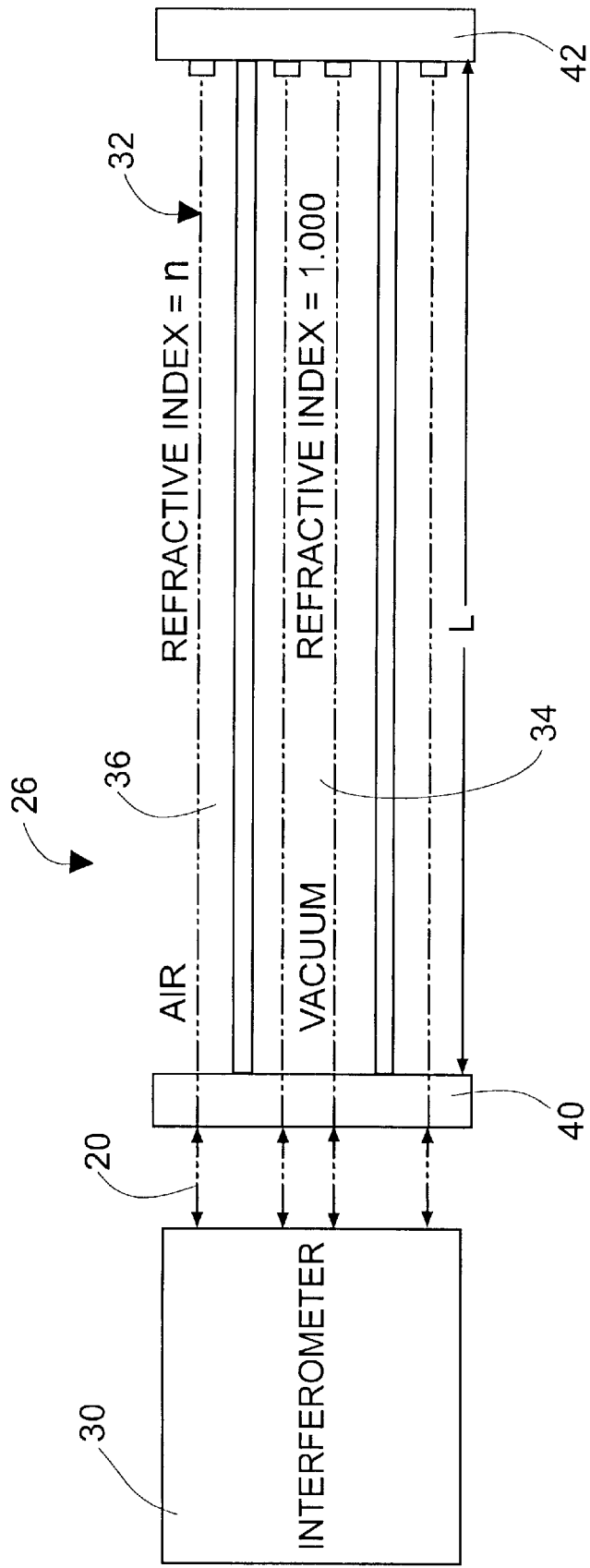
FIG. 2 is a diagrammatic view of a refractometer that may be employed in the apparatus of FIG. 1.

Refractometer 26 may be any of the common types known variously as wavelength trackers or wavelength compensators. It may be combined with environmental sensors (not shown), particularly for initializing system 10 to an absolute index of refraction. FIG. 2 shows an example of refractometer 26, based on a type known as a differential plane-mirror interferometer. As shown, refractometer 26 comprises an interferometer section 30 that directs portions of beam 20 into a concentrically configured measurement cell 32 of fixed length L. Cell 32 comprises an evacuated inner chamber 34 that is surrounded by an outer annular region 36 occupied by gas, preferably air. End reflectors 40 and 42, respectively, are provided to control the propagation of beam 20 as it travels through cell 32. In operation, inner chamber 34 is assigned the role of a reference leg and outer chamber 36 that of a surrogate for the gas or air occupying measurement leg over which physical distance is to be measured. The output of refractometer 26 is a refractive index $N_1$ for the wavelength $\lambda_1$.

Mirror 28, as well as intercepting the portion of beam 20 transmitted by beamsplitter 24, intercepts beam 22 and directs it and the remainder of beam 20 to a two-wavelength interferometer 44. Interferometer 44 is adapted to both measure the distance between it and an X–Y translation stage 46, which may form part of a photolithographic apparatus for the fabrication of integrated circuits or the like, and to provide information about the local index of refraction, $N_1^{2\lambda}$, in the measurement path. The measurement path is located in the intervening space between interferometer 44 and X–Y translation stage 46. As can be seen in FIG. 1, air is controllably flowed over the refractometer 26, i.e., its outer chamber 36 and over the measurement path of interferometer 44. Refractometer 26 is preferably positioned close enough to the measurement path of interferometer 44 so that it can be assumed that the index of refraction of the air in both is substantially the same, at least over measurement time intervals of interest.

Figure 3A:
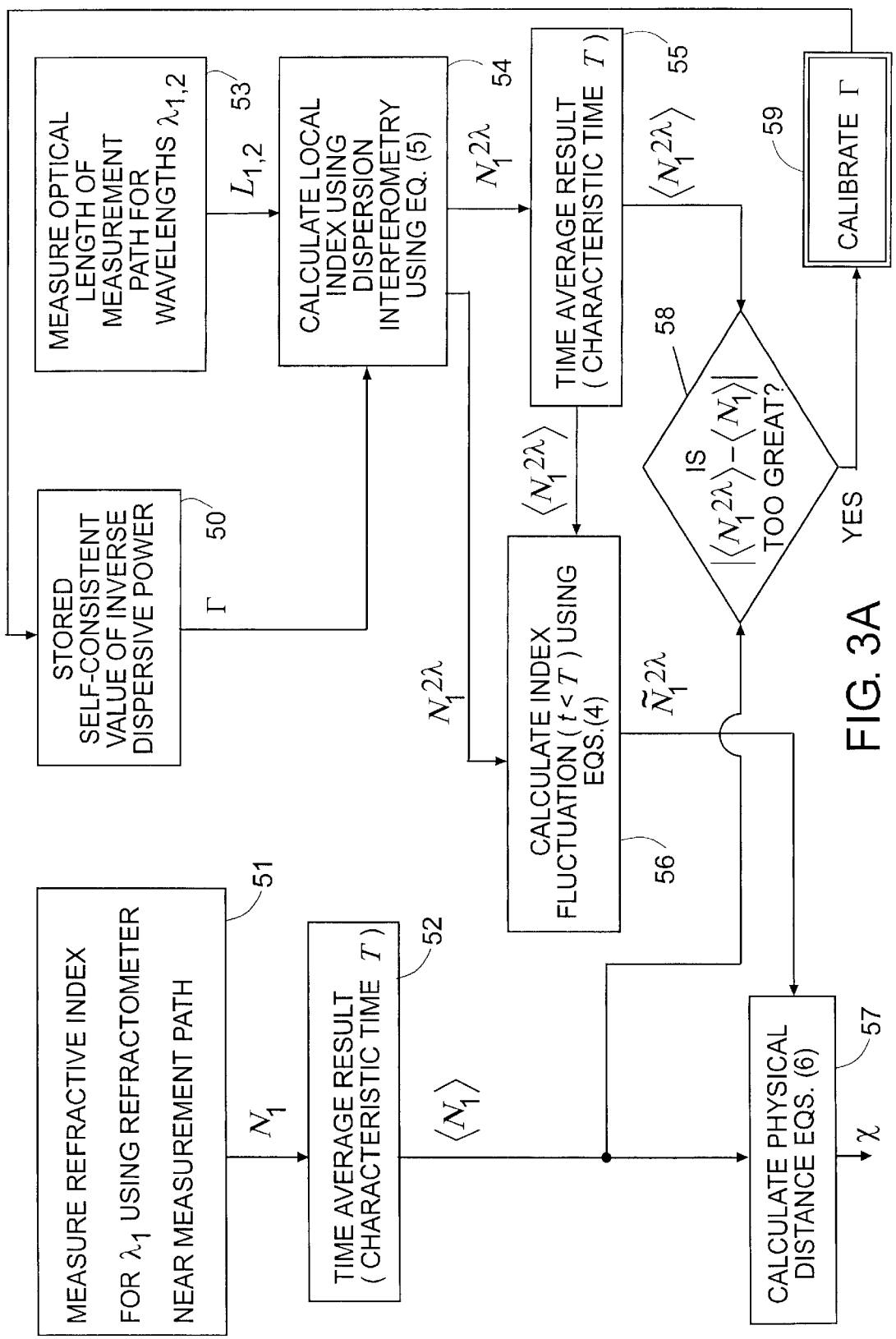
FIGS. 3a and 3b are flowcharts of steps of methods for practicing the invention.

Interferometer 44 here is a dispersion type for which one of the wavelengths, e.g., $\zeta_1$, is also used for standard DMI. Thus, the output of the 2–$\lambda$ interferometer 44 is the interference phases $\phi_{1,2}$ corresponding to $\lambda_{1,2}$, respectively. Interferometer 44 may be any of a variety of well-known types including a common-wavelength differential plane mirror interferometer (DPMI) with each wavelength combined with a dichroic beamsplitter or a two-wavelength dynamic interferometer of the type described in commonly owned co-pending U.S. patent application Ser. No. 09/157,131 filed on Sep. 18, 1998, the contents of which are incorporated herein by reference. System 10 is operated in the manner set forth in the flowcharts of FIGS. 3a and 3b which will be described in more detail later. FIG. 3a represents the measurement mode of operation of system 10 and FIG. 3b the method for initializing $\Gamma$.

To initialize $\Gamma$, X–Y stage 46 shown in FIG. 1 is moved so as to change the physical length of the DMI measurement path over as large a range as possible. The exact value of the displacement need not be known. The move may be part of an alignment procedure on a wafer (more on this later) or it may be an independent motion prior to wafer alignment. The initialized, self-consistent value of $\Gamma$ is then $$\Gamma = \frac{\langle N_1 \rangle - 1}{\langle N_1 \rangle} \frac{L_1}{(L_2 - L_1)}, \quad (1.)$$

where $$L_{1,2} = \phi'_{1,2} \lambda_{1,2} / 2\pi, \quad (2.)$$

and $\phi'_{1,2}$ are the changes in the values of $\phi_{1,2}$ resulting from the displacement of the X–Y stage 46. The quantity $\langle N_1 \rangle$ is the time average of the refractive index $N_1$ calculated from data supplied by the refractometer 26.

The time averaging indicated by the brackets <> may be, for example, the sum of a series of previous measurements, taken over a time period T considered to be sufficiently long to average out air turbulence:

$$\langle N \rangle = \frac{1}{T} \int_{t-T}^{t} N dt \quad (3.)$$

Other appropriate means for calculating the time average include recursive formulas that impart an exponential or other functional dampening having a characteristic time T.

After initialization of $\Gamma$, the 2-wavelength dispersion interferometer provides a continuous measure of index fluctuations $\tilde{N}_1^{2\lambda}$ local to the measurement path:

$$\tilde{N}_1^{2\lambda} = N_1^{2\lambda} - \langle N_1^{2\lambda} \rangle \quad (4.)$$

where $$N_1^{2\lambda} = \frac{L_1}{L_1 - (L_2 - L_1)\Gamma}. \quad (5.)$$

and the brackets <> describe a time averaging over a characteristic time constant T. The DMI measurement of the physical (i.e. index corrected) displacement is $$X = \frac{L_1}{\langle N_1 \rangle + \tilde{N}_1^{2\lambda}} \quad (6.)$$

This calculation is compensated for both long term and short term fluctuations in the index of refraction in the measurement path.

The foregoing calculations involve a characteristic time constant T, which separates short term (T<t) and long term measurements (T>t). Short-term measurements of the index of refraction rely principally on dispersion interferometry, whereas long-term measurements rely principally on the refractometer or equivalent means shown in FIG. 1. Conceptually, T may be regarded as the minimum time interval for which the time-integrated value $\langle N_1 \rangle$ measured at the refractometer 26 correlates within $10^{-9}$ to the true time-integrated index of refraction in the measurement path. Generally, the longer the time T, the better the correlation. A quantitative approach to determining a quantitative value of T is to consider the effect of pockets or cells of air of various sizes moving with a velocity determined by the forced airflow within the system. Suppose a sinusoidal fluctuation in refractive index of amplitude A and a spatial period $\Lambda$. Now imagine a refractometer placed at a distance $D \ll \Lambda$ from the measurement path and let the air flow in the z direction at a velocity v. The resulting maximum error will be $$E \approx 2\pi AD/\Lambda. \quad (7.)$$

Now, suppose that the objective of the compensation system is to reduce refractive index errors by at least a factor of three. This requirement translates to:

$$\Lambda > 6\pi D. \tag{8.}$$

For air moving at a velocity v, this corresponds to a characteristic time $$T = 6\pi D/v. \tag{9.}$$

For example, if the airflow is v=0.5 m/s and the refractometer is 0.5 m from the measurement path, then T is approximately 20 s.

Figure 3B:
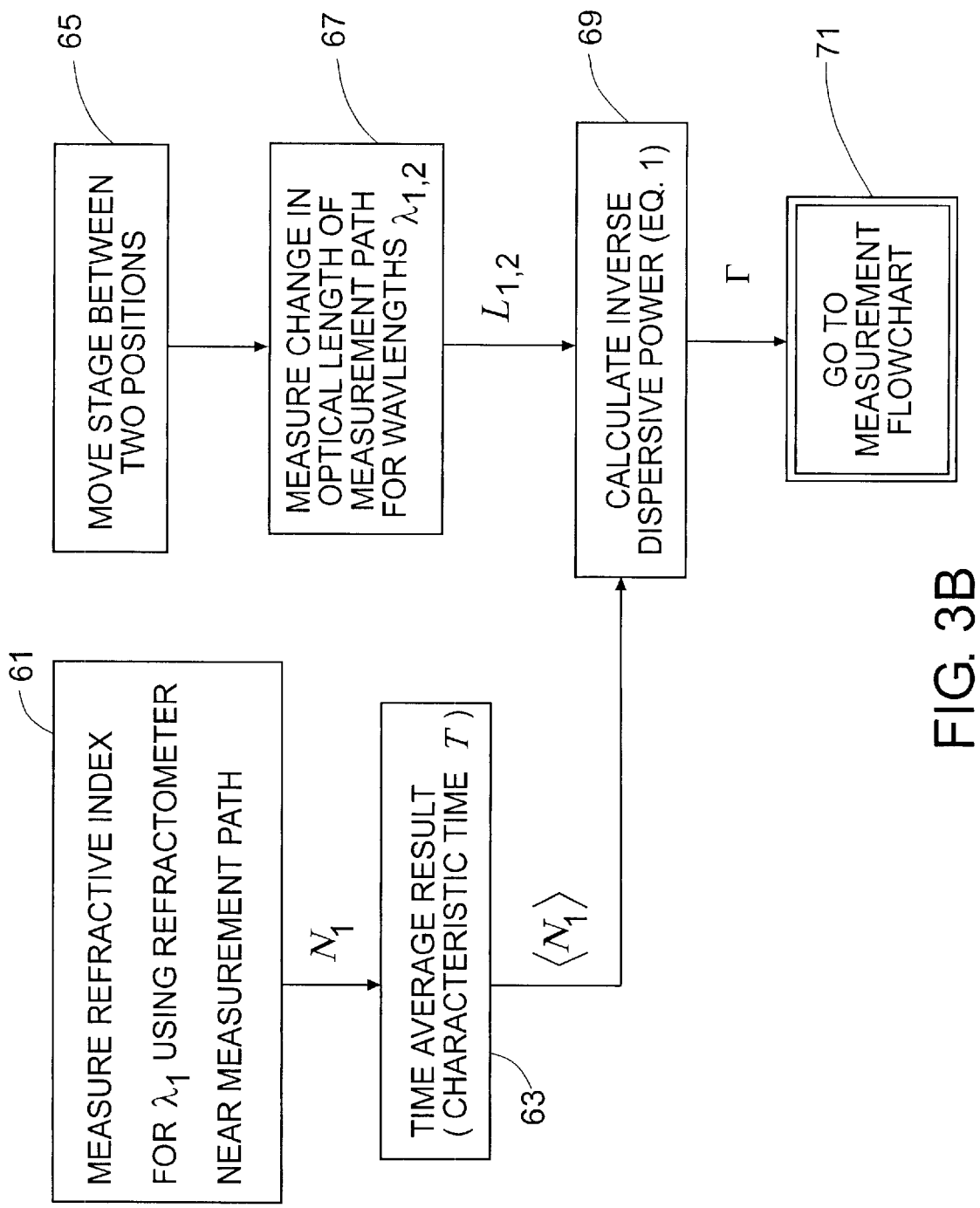

Referring now to FIGS. 3a and 3b, there are shown flowcharts depicting the steps for practicing the method of the invention. As seen, these are given in blocks 50–59 in FIG. 3a, which is for measurement and in blocks 61–71 in FIG. 3b, which is for calibrating $\Gamma$. In FIG. 3a, the measurement steps include:

(50) storing a self-consistent value of inverse dispersive power, $\Gamma$. Initially, this may be assumed and later updated from step (59) as significant changes in it occur;

(51) measuring the refractive index for $\lambda_1$ using a refractometer located near the measurement path;

(52) determining a time average for the refractive index generated in step (50) over a characteristic time period (Eq. 3)

(53) measuring the optical path length of the measurement path for wavelengths, $\lambda_{1,2}$ (Eq. 2);

(54) calculating the local index, $N_1^{2\lambda}$ using dispersion interferometry (Eq. 5);

(55) time averaging the local dispersion (Similar to Eq. 3);

(56) calculating the fluctuation the local index as the difference between the instantaneous value and time averaged value (Eq. 4);

(57) calculating the physical distance corrected for atmospheric effects (Eq. 6); and

(58) testing for the difference between the time averaged value of the local index and the time averaged value of the index at the refractometer; and

(59) calibrating $\Gamma$ and updating its value to block (50) should $\Gamma$ change significantly.

Referring now to FIG. 3b, the steps for calibrating $\Gamma$ are seen to comprise:

(61) measuring the refractive index for $\lambda_1$ using a refractometer near the measurement path;

(63) determining the time average of the refractive index near the measurement path over a characteristic time T;

(65) moving the stage between two positions;

(67) measuring the change in optical path length of the measurement path for two wavelengths, $\lambda_{1,2}$;

(69) calculating the inverse dispersive power, $\Gamma$, using Eq. 1; and

(71) returning to the measurement path with the value for $\Gamma$.

Various benefits flow from the invention compared with the prior art. With respect to a simple refractometer, the invention provides superior compensation for short-term fluctuations in refractive index within the measurement beam that cannot be detected with a refractometer alone. With respect to an ACT system, the invention provides superior long-term compensation with respect to dispersion interferometry by: (1) providing a self-consistent $\Gamma$ that is more accurate than a calculated value; and (2) providing long-term stability in the compensation in the presence of changes in atmospheric composition.

With respect to compensation systems that rely on dispersion for the computation of $\Gamma$, the invention provides lower cost and potentially more accurate long-term compensation by relying on refractometry for refractive index measurements over long time periods. With the inventive apparatus, the dispersion interferometers need only be stable over a period of approximately one minute or even less, rather than several hours. This greatly relaxes requirements on the optics, mechanics, electronics and fiber coupling.

As those skilled in the art will appreciate, there are many possible variants of the invention without departing from its essential teachings.

Figure 4:
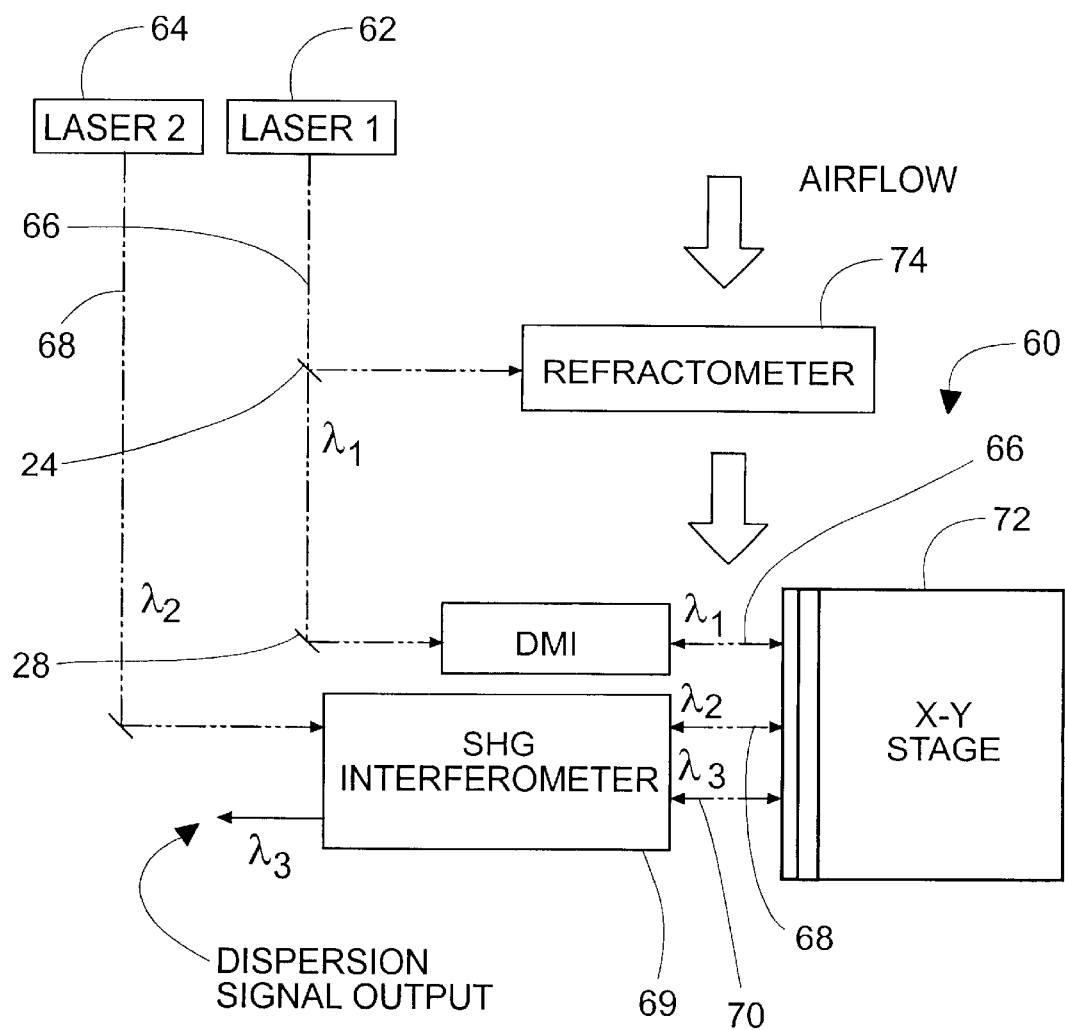
FIG. 4 is a diagrammatic view of an alternative apparatus of the invention employing a second harmonic generator (SHG) dispersion interferometer.

For example, shown in FIG. 4 is an alternate apparatus of the invention designated generally at 60. Apparatus 60 employs two independent lasers, 62 and 64, operating at wavelengths $\lambda_{1,2}$, respectively, to generate beams 66 and 68, respectively. A second-harmonic generation (SHG) interferometer 69 of the type, for example, described in U.S. Pat. No. 4,948,254 by Ishida, is provided to receive beam 68 and generate an additional beam 70 at $\lambda_3$. As before, a refractometer 74 receives beam 66 at $\lambda_1$ and the displacement of an X–Y stage 72 is to be measured. The operating principles of this embodiment are substantially the same as for the prior embodiment. However, in this case, the dispersion calculation involves predicting the index of refraction at a first wavelength $\lambda_1$ using a second and third wavelength $\lambda_{2,3}$ that may be very different from the first. The initialization equation changes to $$\Gamma' = \frac{\langle N_1 \rangle - 1}{\langle N_1 \rangle} \frac{L_1}{(L_3 - L_2)}, \tag{10.}$$

and the refractive index calculations change to $$n_1 = \langle N_1 \rangle + N_1^{2\lambda} - \langle N_1^{2\lambda} \rangle \tag{11.}$$

$$N_1^{2\lambda} = 1 + \Gamma' \frac{(L_3 - L_2)\langle N_1 \rangle}{L_1}. \tag{12.}$$

Note that $\Gamma'$ is no longer the inverse dispersive power in the usual sense, but serves an analogous function in the calculations.

Figure 5:
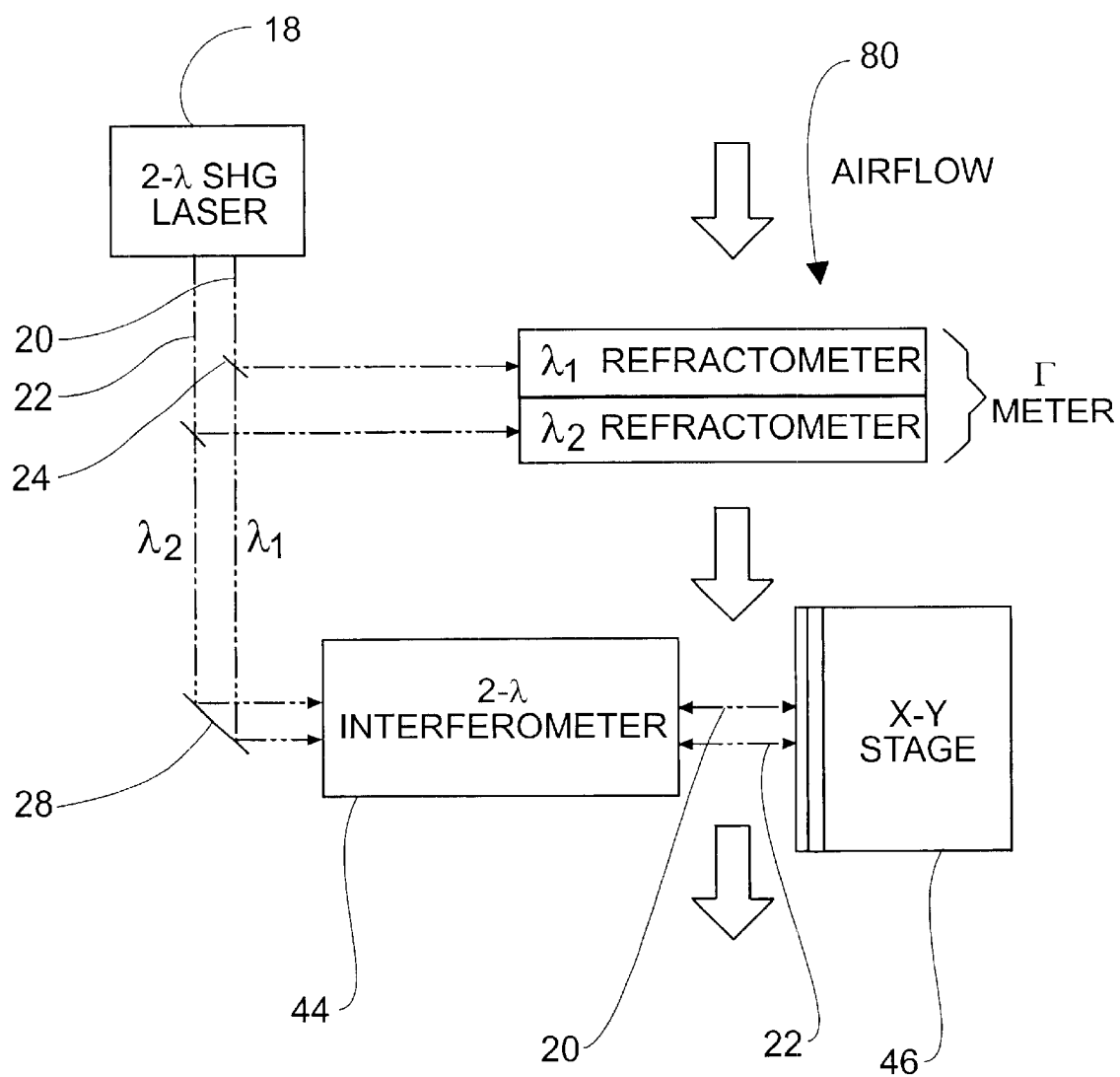
FIG. 5 is a diagrammatic view of an embodiment of the invention employing a dual-wavelength refractometer.

In another embodiment shown in FIG. 5, the simple, single-wavelength refractometer 26 shown in FIG. 1 has been replaced by a form of $\Gamma$-meter, shown symbolically in FIG. 5 as a dual-wavelength refractometer 80 with other parts bearing the same numerical identifiers as their counterparts in FIG. 1. This embodiment is capable of tracking slow changes in the value of $\Gamma$ without having to re-initialize the system with a stage motion. However, for long-term changes in refractive index, this embodiment continues to rely on the refractometry data alone, rather than on dispersion interferometry.

Figure 6:
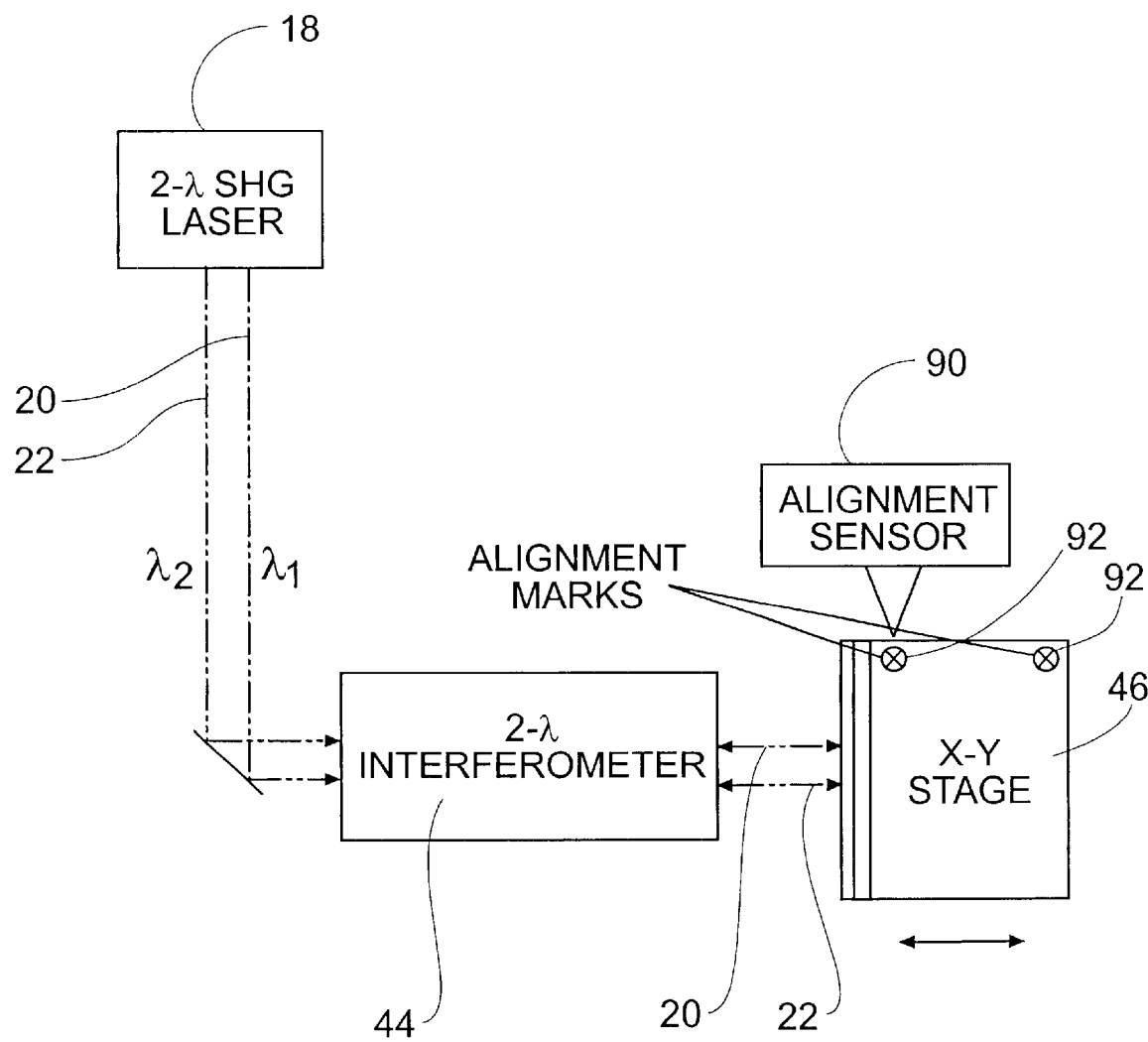
FIG. 6 is a diagrammatic view of an embodiment of the invention employing alignment marks to initialize both refractive index and inverse dispersive power.

In yet another embodiment shown in FIG. 6, there is no refractometer at all. Instead, reliance is made on alignment marks 92 carried on X–Y translation stage 46 (again parts in common with FIG. 1 bear the same numerical identification here) and an alignment sensor 90 for locating these marks. The basic assumption of this embodiment is that the physical path length $\chi_0$ between the marks 92 is either perfectly known or is a suitable reference length for all subsequent measurements. After a displacement between the marks 92, the initial index of refraction is determined from $$N_1^0 = L_1/\chi_0, \tag{13.}$$

where $L_1$ is the measured optical path for wavelength $\lambda_1$. The self-consistent $\Gamma$ is $$\Gamma = (N_1^0 - 1)\frac{\chi_0}{(L_2 - L_1)}. \quad (14.)$$

All subsequent measurements of a physical displacement $\chi$ use $$\chi = L_1/n_1, \quad (15.)$$

where $$n_1 = 1 + \Gamma \frac{(L_2 + L_1)}{\chi_0}. \quad (16.)$$

This embodiment has the advantage of the greatest simplicity in hardware; however, it may not be suitable for applications which require very long term measurement stability independent of the stability in the physical location of the alignment marks.

The interferometry systems described above can be especially useful in lithography applications associated with their X–Y stages and used for fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p82 (1997). Overlay depends directly on the performance, i.e. accuracy and precision, of the distance measuring interferometers used to position the wafer and reticle (or mask) stages. Since a lithography tool may produce $50–100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the photoresist that convert the radiation pattern into a latent image within the photoresist.

The interferometry systems described above are important components of the positioning mechanisms that control the position of the wafer and reticle, and register the reticle image on the wafer.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes photoresist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which are incorporated herein by reference.

The interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, the interferometry systems can be used to measure the position of any one component of the exposure system relative to any other component of the exposure system in which the interferometry system is attached, or supported by one of the components and the measurement object is attached, or is supported by the other of the components.

Figure 7:
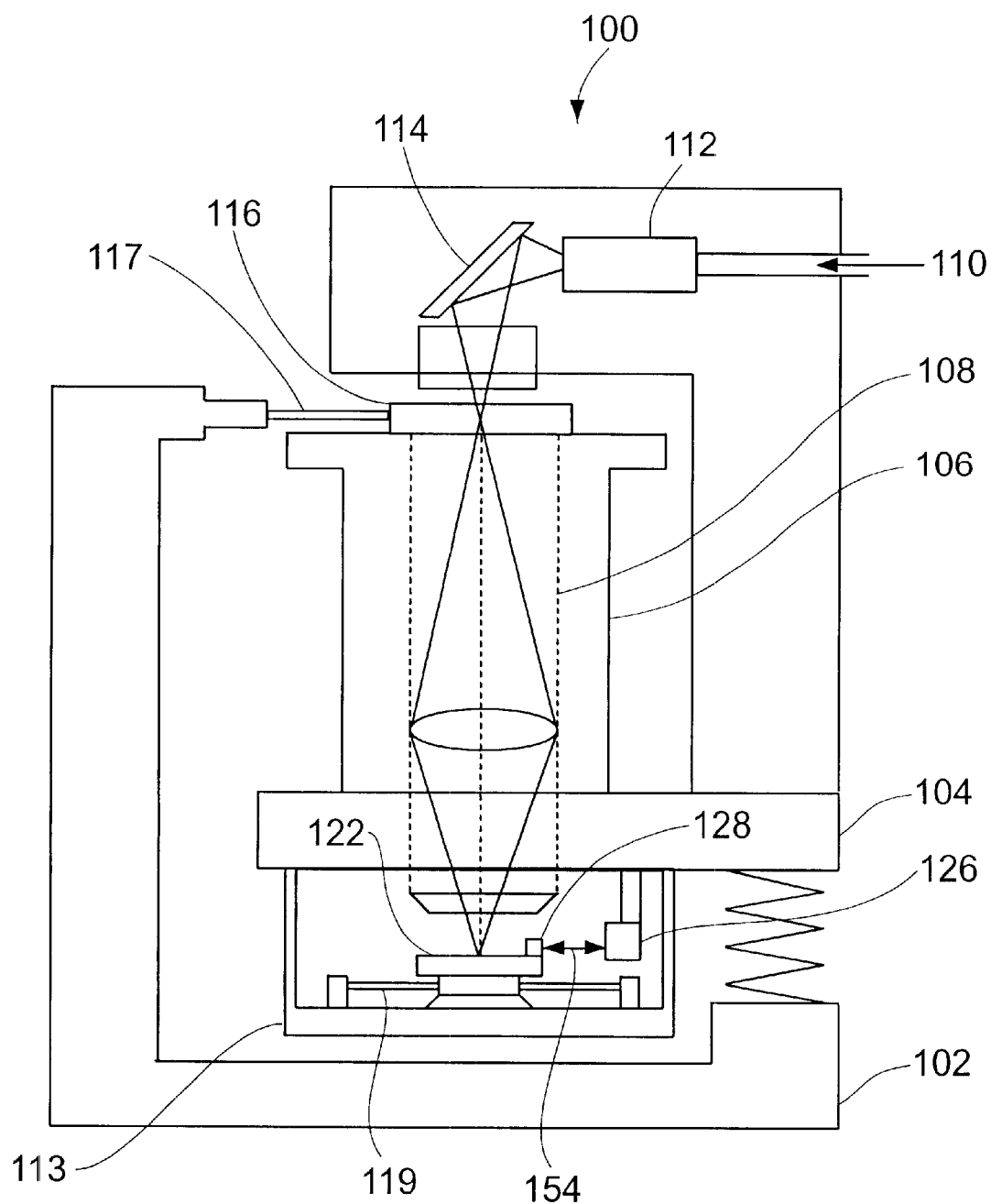

An example of a lithography scanner 100 using an interferometry system 126 is shown in FIG. 7. The interferometry system is used to precisely measure the position of a wafer within an exposure system. Here, stage 122 is used to position the wafer relative to an exposure station. Scanner 100 comprises a frame 102, which carries other support structures and various components carried on those structures. An exposure base 104 has mounted on top of it a lens housing 106 atop of which is mounted a reticle or mask stage 116 used to support a reticle or mask. A positioning system for positioning the mask relative to the exposure station is indicated schematically by element 117. Positioning system 117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 104 is a support base 113 that carries wafer stage 122. Stage 122 includes a plane mirror for reflecting a measurement beam 154 directed to the stage by interferometry system 126. A positioning system for positioning stage 122 relative to interferometry system 126 is indicated schematically by element 119. Positioning system 119 can include, e.g., piezoelectric transducer elements and corresponding control electronics. The measurement beam reflects back to the interferometry system, which is mounted on exposure base 104. The interferometry system can be any of the embodiments described previously.

During operation, a radiation beam 110, e.g., an ultraviolet (UV) beam from a UV laser (not shown), passes through a beam shaping optics assembly 112 and travels downward after reflecting from mirror 14. Thereafter, the radiation beam passes through a mask (not shown) carried by mask stage 116. The mask (not shown) is imaged onto a wafer (not shown) on wafer stage 122 via a lens assembly 108 carried in a lens housing 106. Base 104 and the various components supported by it are isolated from environmental vibrations by a damping system depicted by spring 120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In addition, the lithographic scanner can include a column reference in which interferometry system 126 directs the reference beam to lens housing 106 or some other structure that directs the radiation beam rather than a reference path internal to the interferometry system. The interference signal produced by interferometry system 126 when combining measurement beam 154 reflected from stage 122 and the reference beam reflected from lens housing 106 indicates changes in the position of the stage relative to the radiation beam. Furthermore, in other embodiments the interferometry system 126 can be positioned to measure changes in the position of reticle (or mask) stage 116 or other movable components of the scanner system. Finally, the interferometry systems can be used in a similar fashion with lithography systems involving steppers, in addition to, or rather than, scanners.

Figure 8:
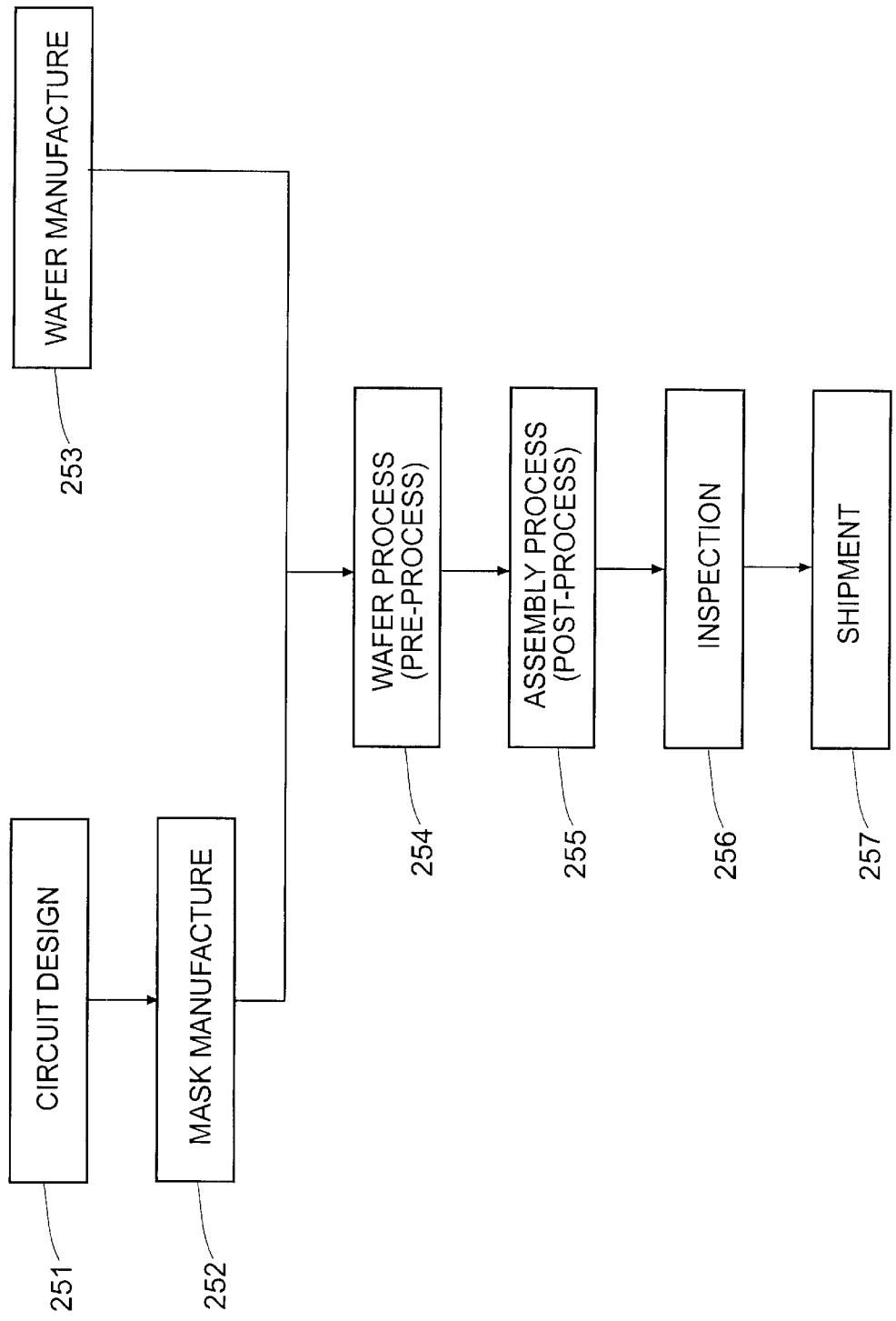

As is well known in the art, lithography is a critical part of manufacturing methods for making semiconducting devices. For example, U.S. Pat. No. 5,483,343 outlines steps for such manufacturing methods. These steps are described below with reference to FIGS. 8 and 9. FIG. 8 is a flowchart of the sequence of manufacturing a semiconductor device such as a semiconductor chip (e.g. IC or LSI), a liquid crystal panel or a CCD. Step 251 is a design process for designing the circuit of a semiconductor device. Step 252 is a process for manufacturing a mask on the basis of the circuit pattern design. Step 253 is a process for manufacturing a wafer by using a material such as silicon.

Step 254 is a wafer process which is called a pre-process wherein, by using the so prepared mask and wafer, circuits are formed on the wafer through lithography. Step 255 is an assembling step, which is called a post-process wherein the wafer processed by step 254 is formed into semiconductor chips. This step includes assembling (dicing and bonding) and packaging (chip sealing). Step 256 is an inspection step wherein operability check, durability check, and so on of the semiconductor devices produced by step 255 are carried out. With these processes, semiconductor devices are finished and they are shipped (step 257).

Figure 9:
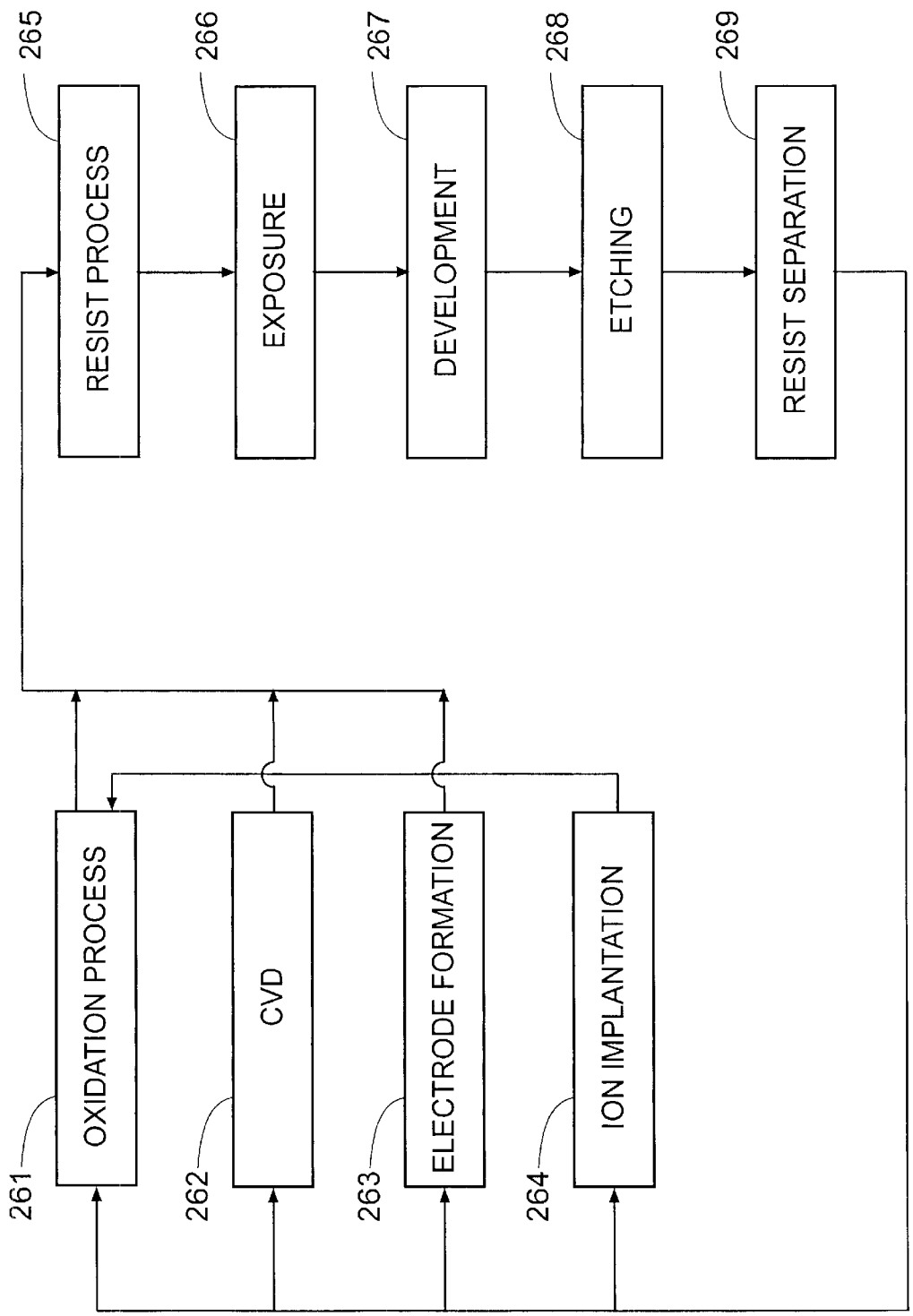

FIG. 9 is a flowchart showing details of the wafer process. Step 261 is an oxidation process for oxidizing the surface of a wafer. Step 262 is a CVD process for forming an insulating film on the wafer surface. Step 263 is an electrode forming process for forming electrodes on the wafer by vapor deposition. Step 264 is an ion implanting process for implanting ions to the wafer. Step 265 is a photoresist process for applying a photoresist (photosensitive material) to the wafer. Step 266 is an exposure process for printing, by exposure, the circuit pattern of the mask on the wafer through the exposure apparatus described above. Step 267 is a developing process for developing the exposed wafer. Step 268 is an etching process for removing portions other than the developed photoresist image. Step 269 is a photoresist separation process for separating the photoresist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 10:
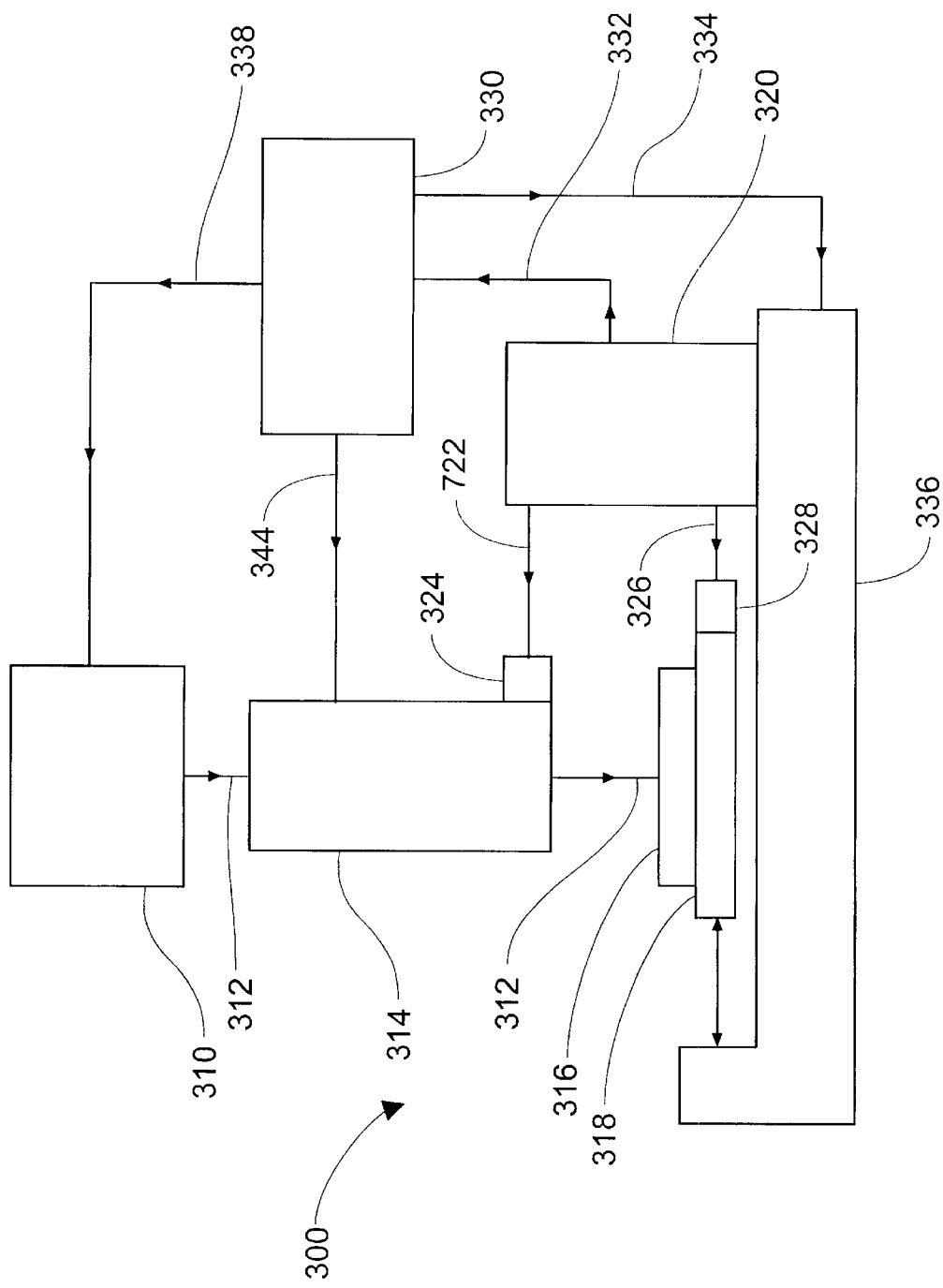
FIG. 10 is a schematic of a beam writing system employing the interferometry system of the invention.

As an example, a schematic of a beam writing system 300 is shown in FIG. 10. A source 310 generates a write beam 312, and a beam focusing assembly 314 directs the radiation beam to a substrate 316 supported by a movable stage 318. To determine the relative position of the stage, an interferometry system 320 directs a reference beam 322 to a mirror 324 mounted on beam focusing assembly 314 and a measurement beam 326 to a mirror 328 mounted on stage 318. Interferometry system 320 can be any of the interferometry systems described previously. Changes in the position measured by the interferometry system correspond to changes in the relative position of write beam 312 on substrate 316. Interferometry system 320 sends a measurement signal 332 to controller 330 that is indicative of the relative position of write beam 312 on substrate 316. Controller 330 sends an output signal 334 to a base 336 that supports and positions stage 318. In addition, controller 330 sends a signal 338 to source 310 to vary the intensity of, or block, write beam 312 so that the write beam contacts the substrate with an intensity sufficient to cause photophysical or photochemical change only at selected positions of the substrate. Furthermore, in some embodiments, controller 330 can cause beam focusing assembly 314 to scan the write beam over a region of the substrate, e.g., using signal 344. As a result, controller 330 directs the other components of the system to pattern the substrate. The patterning is typically based on an electronic design pattern stored in the controller. In some applications the write beam patterns a photoresist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics for focusing and directing the radiation to the substrate.

Yet other changes may be made to the invention. For example, it may be desirable in certain applications to monitor the refractive index of the gas contained on both the reference and in the measurement legs of the interferometer. Examples include the well-known column reference style of interferometer, in which the reference leg comprises a target optic placed at one position within a mechanical system, and the measurement leg comprises a target optic placed at a different position within the same mechanical system. Another example relates to application of the measurement of small angles, for which both the measurement and reference beams impinge upon the same target optic but at a small physical offset, thereby providing a sensitive measure of the angular orientation of the target optic. In addition, it will be appreciated that a separate displacement interferometer may be employed with a separate dispersion interferometer. These applications and configurations are well known to those skilled in the art and the necessary modifications are intended to be within the scope of the invention.

What is claimed is:

1. An interferometric apparatus comprising:

a source for generating at least two beams having different wavelengths;

dispersion interferometer means having a measurement path whose length may be varied, a first mode of operation in which it provides information to enable the calculation of initial and updated values of inverse dispersive power, $\Gamma$, and its equivalent, and a second mode of operation in which it provides information about short term index of refraction variations of air in said measurement path at both of said wavelengths and to measure the length of said measurement path using the current value for $\Gamma$ as determined in said first mode of operation;

refractometer means proximate said measurement path for directly measuring the long-term variations in refractive index of air outside of said measurement path for at least said first wavelength while said dispersion interferometer means makes measurements in said measurement path; and means for:

(1) placing said dispersion interferometer in said first mode of operation in which said measurement path is varied between at least two positions, receiving measurements from said refractometer means about long-term variations in the refractive index of air near said measurement path and averaging said long-term index variations over a predetermined time period while said dispersion interferometer is in its first mode of operation, using said average value of said long-term index of refraction to calculate an initial value of $\Gamma$ on the assumption that said average value of said long-term index of refraction is substantially the same as the index of refraction in said measurement path when said refractometer means is in said second mode of operation, and storing said initial value of $\Gamma$ for subsequent computational use, and (2) placing said dispersion interferometer in said second mode of operation in which said dispersion interferometer means generates measurements about short-term variations in the index of refraction in said measurements path, averaging said short term measurements and determining the difference between the instantaneous value of said short-term index value and its average value; continuously comparing said difference with the average value of the long-term index of refraction and determining if a comparison limit is exceeded and, if so, updating the current value of $\Gamma$ by re-entering said first mode of said dispersion interferometer means and, if not, remaining in said second mode of operation of said dispersion interferometer means and calculating the physical length of said measurement path using the current value for $\Gamma$.

2. The interferometric apparatus of claim 1 wherein said source comprises a laser and second harmonic generation means for frequency doubling the output of said laser to generate said two beams.

3. The interferometric apparatus of claim 1 wherein said dispersion interferometer means further includes second harmonic generation means for receiving one of said beams and generating another beam at a third wavelength for generating dispersion information about said measurement path.

4. The interferometric apparatus of claim 1 wherein said refractometer means comprises two refractometers operating at two different wavelengths to generate information about the inverse dispersion power.

5. The interferometric apparatus of claim 1 wherein said refractometer means for measuring the long term refractive index of air comprises a pair of reference marks on a translation stage having a known physical length between them, generating information relating to the optical path length corresponding to the distance between the reference marks, and determining the index based on the ratio of the optical path length to the physical path length.

6. The interferometric apparatus of claim 1 further including a microlithographic means operatively associated with said interferometric apparatus for fabricating wafers, said microlithographic means comprising:

at least one stage for supporting a wafer;

an illumination system for imaging spatially patterned radiation onto the wafer; and a positioning system for adjusting the position of said at least one stage relative to the imaged radiation;

wherein said interferometric apparatus is adapted to measure the position of the wafer relative to the imaged radiation.

7. The interferometric apparatus of claim 1 further including a microlithographic means operatively associated with said interferometric apparatus for use in fabricating integrated circuits on a wafer, said microlithographic means comprising:

at least one stage for supporting a wafer;

an illumination system including a radiation source, a mask, a positioning system, a lens assembly, and predetermined portions of said interferometric apparatus, said microlithographic means being operative such that the source directs radiation through said mask to produce spatially patterned radiation, said positioning system adjusts the position of said mask relative to radiation from said source, said lens assembly images said spatially patterned radiation onto the wafer, and said interferometric apparatus measures the position of said mask relative to said radiation from said source.

8. The interferometric apparatus of claim 1 further including microlithographic apparatus operatively associated with said interferometric apparatus for fabricating integrated circuits comprising first and second components, said first and second components being moveable relative to one another and said interferometric apparatus, said first and second components being connected with said first and second measurements legs, respectively, moving in concert therewith, such that said interferometric apparatus measures the position of said first component relative to said second component.

9. The interferometric apparatus of claim 1 further including a beam writing system operatively associated with said interferometric apparatus for use in fabricating a lithography mask, said beam writing system comprising:

a source for providing a write beam to pattern a substrate;

at least one stage for supporting a substrate;

a beam directing assembly for delivering said write beam to the substrate; and a positioning system for positioning said at least one stage and said beam directing assembly relative to one another, said interferometric apparatus being adapted to measure the position of said at least one stage relative to said beam directing assembly.

10. An interferometric method comprising the steps of:

generating at least two beams having different wavelengths;

receiving said beams in dispersion interferometer means having a measurement path whose length may be varied, a first mode of operation in which it is adapted to provide information to calculate initial and updated values of inverse dispersive power, $\Gamma$, and its equivalent, and a second mode of operation in which it provides information about short term index of refraction variations of air in said measurement path at both of said wavelengths and to measure the length of said measurement path using the current value for $\Gamma$ as determined in said first mode of operation;

directly measuring the long-term variations in refractive index of air outside and proximate said measurement path for at least said first wavelength while measurements in said measurement path are being made by said dispersion interferometer means; and placing said dispersion interferometer in said first mode of operation in which said measurement path is varied between at least two positions, receiving measurements from said refractometer means about long-term variations in the refractive index of air near said measurement path and averaging said long-term index variations over a predetermined time period while said dispersion interferometer is in its first mode of operation, using said average value of said long-term index of refraction to calculate an initial value of $\Gamma$ on the assumption that said average value of said long-term index of refraction is substantially the same as the index of refraction in said measurement path when said refractometer means is in said second mode of operation, and storing said initial value of $\Gamma$ for subsequent computational use, and placing said dispersion interferometer in said second mode of operation in which said dispersion interferometer means generates measurements about short-term variations in the index of refraction in said measurement path, averaging said short term measurements and determining the difference between the instantaneous value of said short-term index value and its average value; continuously comparing said difference with the average value of the long-term index of refraction and determining if a comparison limit is exceeded and, if so, updating the current value of $\Gamma$ by re-entering said first mode of said dispersion interferometer means and, if not, remaining in said second mode of operation of said dispersion interferometer means and calculating the length of said measurement path using the current value for $\Gamma$.

11. The interferometric method of claim 10 wherein said beams are provided by a laser and second harmonic generation means for frequency doubling the output of said laser to generate said two beams.

12. The interferometric method of claim 10 wherein said dispersion interferometer means further includes second harmonic generation means for receiving one of said beams and generating another beam at a third wavelength for generating dispersion information about the measurement path.

13. The interferometric method of claim 10 wherein the step of measuring the long term refractive index of air employs a refractometer.

14. The interferometric method of claim 13 wherein said refractometer comprises two refractometers operating at two different wavelengths to generate information about the inverse dispersion power.

15. The interferometric method of claim 10 wherein said step of measuring the long term refractive index of air employs a pair of reference marks on a translation stage having a known physical length between them, generating information relating to the optical path length corresponding to the distance between the reference marks, and determining the index based on the ratio of the optical path length to the physical path length.

16. The interferometric method of claim 10 further including a microlithographic steps for fabricating wafers, said microlithographic steps comprising:

at least one stage for supporting a wafer on at least one wafer stage;

imaging spatially patterned radiation onto the wafer; and adjusting the position of said at least one stage relative to the imaged radiation;

wherein said interferometric method measures the position of the wafer relative to the imaged radiation.

17. The interferometric method of claim 10 further including a microlithographic steps for use in fabricating integrated circuits on a wafer, said microlithographic steps comprising:

supporting a wafer on at least one stage;

providing an illumination system including a radiation source, a mask, a positioning system, and a lens assembly directing radiation through said mask to produce spatially patterned radiation, adjusting the position of said mask relative to radiation from said source, said lens assembly imaging said spatially patterned radiation onto the wafer, and measuring the position of said mask relative to said radiation from said source.

18. The interferometric method of claim 10 further including microlithographic steps for fabricating integrated circuits comprising first and second components, said first and second components being moveable relative to one another and an interferometric apparatus, said first and second components being connected with first and second measurement legs, respectively, moving in concert therewith, such that said interferometric apparatus measures the position of said first component relative to said second component.

19. The interferometric method of claim 10 further including a beam writing process for use in fabricating a lithography mask, said beam writing process comprising the steps of:

providing a write beam to pattern a substrate;

supporting a substrate on at least one stage;

delivering said write beam to the substrate; and positioning said at least one stage and said beam relative to one another, said interferometric process being adapted to measure the position of said at least one stage relative to said beam directing assembly.

20. An interferometric method comprising the steps of:

measuring the long-term refractive index for at least one wavelength, $\lambda_1$, using a refractometer near a measurement path;

determining the time average of said long-term refractive index near said measurement path over a characteristic time T;

moving an interferometer stage between two positions to vary the length of said measurement path;

measuring the change in optical path length of said measurement path for two wavelengths, $\lambda_{1,2}$, using dispersion interferometry and said average value of said long-term refractive index;

calculating the inverse dispersive power, $\Gamma$, using the average value of said long-term refractive index;

storing said value of $\Gamma$ as a current value;

continue measuring the long-term refractive index for $\lambda_1$ using the refractometer located near a measurement path;

continue determining the time average for the refractive index generated over the characteristic time period;

measuring the optical path length of the measurement path for wavelengths, $\lambda_{1,2}$;

calculating the local index, $N_1^{2\lambda}$ in said measurement path using dispersion interferometry and said stored current value of said inverse dispersive power $\Gamma$;

time averaging said local refractive index;

continuously calculating the fluctuation of said local refractive index as the difference between the instantaneous value and time averaged value;

continuously testing for the difference between the time averaged value of said local index and the time averaged value of said long-term index at said refractometer; and (1) calibrating $\lambda$ and updating its value should said difference change by a predetermined limit, or (2) calculating the physical length of the measurement path if said difference should not exceed said predetermined limit.

* * * * *